US010103279B2

(12) United States Patent
Ningaraju et al.

(10) Patent No.: US 10,103,279 B2
(45) Date of Patent: Oct. 16, 2018

(54) HIGH VOLTAGE PIN DIODE

(71) Applicant: Nuvoton Technology Corporation, Hsinchu (TW)

(72) Inventors: Vivek Ningaraju, Hsinchu (TW); Gene Sheu, Hsinchu (TW); Po-An Chen, Hsinchu (TW); Subramanya Jayasheela Rao, Hsinchu (TW); Aanand, Taichung (TW); Syed Sarwar Imam, Taichung (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 15/857,636

(22) Filed: Dec. 29, 2017

(65) Prior Publication Data

US 2018/0190836 A1    Jul. 5, 2018

(30) Foreign Application Priority Data

Dec. 29, 2016    (TW) .............................. 105219865 U

(51) Int. Cl.
*H01L 29/868*    (2006.01)
(52) U.S. Cl.
CPC ................... *H01L 29/868* (2013.01)
(58) Field of Classification Search
CPC ..................................................... H01L 29/868
USPC ................................................ 257/538, 656
See application file for complete search history.

(56) References Cited

U.S. PATENT DOCUMENTS

| 6,794,734 | B2 | 9/2004 | Hoag et al. | |
| 9,373,619 | B2 * | 6/2016 | Su | H01L 27/0802 |
| 9,735,188 | B2 * | 8/2017 | Kim | H01L 27/142 |

OTHER PUBLICATIONS

Chang et al, "On-chip ESD protection design for GHz RF integrated circuits by using polysilicon diodes in sub-quarter-micron CMOS process," proceedings of Technical Papers of International Symposium on VLSI Technology, Systems, and Applications, Apr. 18-20, 2001, pp. 240-243.

* cited by examiner

*Primary Examiner* — Mohammed Shamsuzzaman
(74) *Attorney, Agent, or Firm* — JCIPRNET

(57) ABSTRACT

A PIN diode is formed on an insulating structure on a substrate of semiconductor. The insulating structure is disposed on a high voltage doped region in the substrate. The PIN diode includes a semiconductor layer, disposed on the insulating structure. The semiconductor layer includes a first doped region of a first conductivity type, at least one second doped region of a second conductivity type, and at least one intrinsic region without being doped or lightly doped between the first doped region and the at least one second doped region. The first conductive type is opposite to the second conductivity type. At least one interconnection structure is disposed on the insulating structure to electrically connect the at least one intrinsic region to the high voltage doped well.

9 Claims, 4 Drawing Sheets

HIGH VOLTAGE PIN DIODE

CROSS-REFERENCE TO RELATED APPLICATION

This application claims the priority benefit of Taiwan application serial no. 105219865, filed on Dec. 29, 2016. The entirety of the above-mentioned patent application is hereby incorporated by reference herein and made a part of this specification.

BACKGROUND OF THE INVENTION

1. Field of the Invention

The present invention generally relates to a semiconductor device, in particular, to a structure of Positive-Intrinsic-Negative (PIN) diode.

2. Description of Related Art

The difference of a PIN diode from a usual PN diode based on a junction between materials of P-type carrier and N-type carrier is that the PIN diode has a wide intrinsic region. This intrinsic region remains as the semiconductor material without doping.

FIG. 1 is a drawing, schematically illustrating a cross-sectional structure of a conventional PIN diode. Referring to FIG. 1, an insulating structure 30 of shallow trench isolation (STI) structure or field oxidation isolation (FOX) is formed on the substrate 20. The PIN diode 40 is formed on the insulating substrate 30 of STI. The PIN diode 40 is usually formed by an additional Si semiconductor material. As shown by the cross-sectional structure along the longitudinal direction, the PIN diode 40 includes a P+ doped region 42, an intrinsic region 44 and an N+ doped region 46. The feature of PIN diode 40 is that the intrinsic region 44 is further included between the P+ doped region 42 and the N+ doped region 46. The intrinsic region 44 is not doped. The carrier concentration maintains at the intrinsic concentration of the silicon material and is much lower than the carrier concentration in the P+ doped region 42 and the N+ doped region 46.

Since the intrinsic region 44 of the PIN diode 40 respectively form two junctions with respect to the P+ doped region 42 and the N+ doped region 46, it would form two parasitic capacitors coupled in series, so to reduce the parasitic capacitance. The PIN diode 40 can have wide applications, in which it can be a high frequency device as an example, operated at high voltage range. The invention does not further describe the basic structure and its applications of the PIN diode 40.

One of the factors to be concerned in application of the PIN diode 40 includes the value of breakdown voltage, so to adapt to the use in high voltage circuit. If the breakdown voltage of the PIN diode 40 is higher, then the PIN diode 40 can endure a higher voltage. This is an advantage for the application in high voltage circuit.

How to improve the breakdown voltage of the PIN diode is one of the issues needed to be considered in designing the PIN diode.

SUMMARY OF THE INVENTION

The present invention is directed to a PIN diode structure, in which the breakdown voltage of PIN diode can be improved.

The PIN diode of the invention is formed on an insulating structure on a substrate of semiconductor. The insulating structure is disposed on a high voltage doped region in the substrate. The PIN diode includes a semiconductor layer, disposed on the insulating structure. The semiconductor layer includes a first doped region of a first conductivity type, at least one second doped region of a second conductivity type opposite to the first conductive type, and at least one intrinsic region without being doped or lightly doped between the first doped region and the at least one second doped region. At least one interconnection structure is disposed on the insulating structure to electrically connect the at least one intrinsic region to the high voltage doped well.

In an embodiment of the invention, numbers of the at least one second doped region, the at least one intrinsic region and the at least one inter interconnection structure are same by 1 or 2 or larger than 2.

In an embodiment of the invention, the insulating structure is a buried oxide layer or shallow trench isolation layer, or a field oxidation layer.

In an embodiment of the invention, the first conductive type is N conductive type and the second conductive type is P conductive type, or first conductive type is P conductive type and the second conductive type is N conductive type.

In an embodiment of the invention, the first doped region of the semiconductor layer is a common region, the at least one second doped region with the at least one intrinsic region is extending outward from the first doped region.

In an embodiment of the invention, the at least one intrinsic region is between the first doped region and the at least one second doped region by a length of at least 2 microns.

In an embodiment of the invention, the at least intrinsic region is between the first doped region and the at least one second doped region by a length in a range of 4 microns to 6 microns.

In an embodiment of the invention, a position of the at least one intrinsic region being respectively connected with the at least one interconnection structure is at a middle region between the first doped region and the at least one second doped region.

In an embodiment of the invention, the at least one intrinsic region comprises a connection region extending outward, used to connect with the least one interconnection structure.

In an embodiment of the invention, a position of the connection region has a distance with respect to the first doped region and the at least one second doped region.

In an embodiment of the invention, the high voltage doped well is the first conductive type, the high voltage doped well further has a surface doped region of the first conductive type in electrical connection to the at least one interconnection structure, used to provide a voltage level as obtained at the at least one interconnection structure to the high voltage doped well.

As to the foregoing descriptions, the PIN diode structure of the invention cause the voltage level of the intrinsic region to be transmitted to the high voltage doped well at the lower part, so the voltage level of the high voltage doped well is close to a middle level of the bias between the anode and the cathode. This can avoid the breakdown of the PIN diode and then the breakdown voltage of the PIN diode can be improved.

BRIEF DESCRIPTION OF THE DRAWINGS

The accompanying drawings are included to provide a further understanding of the invention, and are incorporated

DESCRIPTION OF THE EMBODIMENTS

Figure 1:
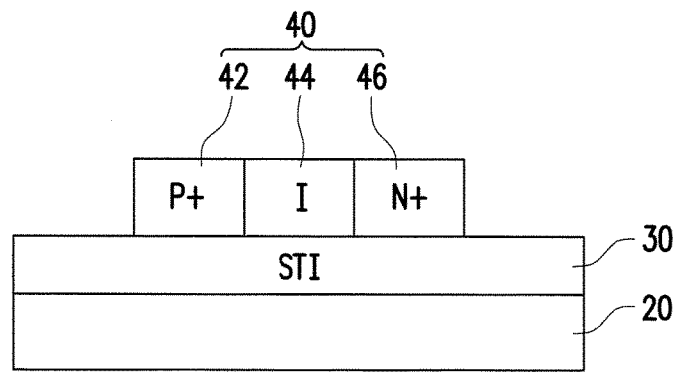
FIG. 1 is a drawing, schematically illustrating a cross-sectional structure of a conventional PIN diode.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1 again, as to the semiconductor structure of the PIN diode, it is a P-I-N structure, in which P represents the region doped by P-type carriers, represents the region without being doped, N represents a region doped by N-type carriers, so it is called PIN diode.

The invention has further looked into the conventional PIN diode structure, in which the P+ doped region 42 is anode and the N+ doped region 46 is cathode. In operation, a high voltage bias exits between the anode and the cathode, such as 60 V or larger, which cause a current flowing through the intrinsic region 44. However, when the substrate 20 at the lower part is connected to the ground voltage (Vcc), it would induce a perpendicular electric field, perpendicular to the substrate 20. This perpendicular electric field still remains in a rather strong level. When the voltage bias is larger, the strength of the perpendicular electric field gets stronger as well, causing a breakdown of the PIN diode.

The PIN diode structure as proposed by the invention, in an example, can cause the voltage level of the intrinsic region to be transmitted to the high voltage doped well at the lower part via the interconnection structure. As a result, the voltage level of the high voltage doped well can be close to a middle level of the bias between the anode and the cathode. This can avoid the breakdown of the PIN diode and then the breakdown voltage of the PIN diode can be improved.

The invention has provided multiple embodiments for descriptions. However, the invention is not limited to the embodiments. Further, the multiple embodiments as provided allow a proper combination between them, that is, each embodiment is not just an independent embodiment itself.

Figure 2:
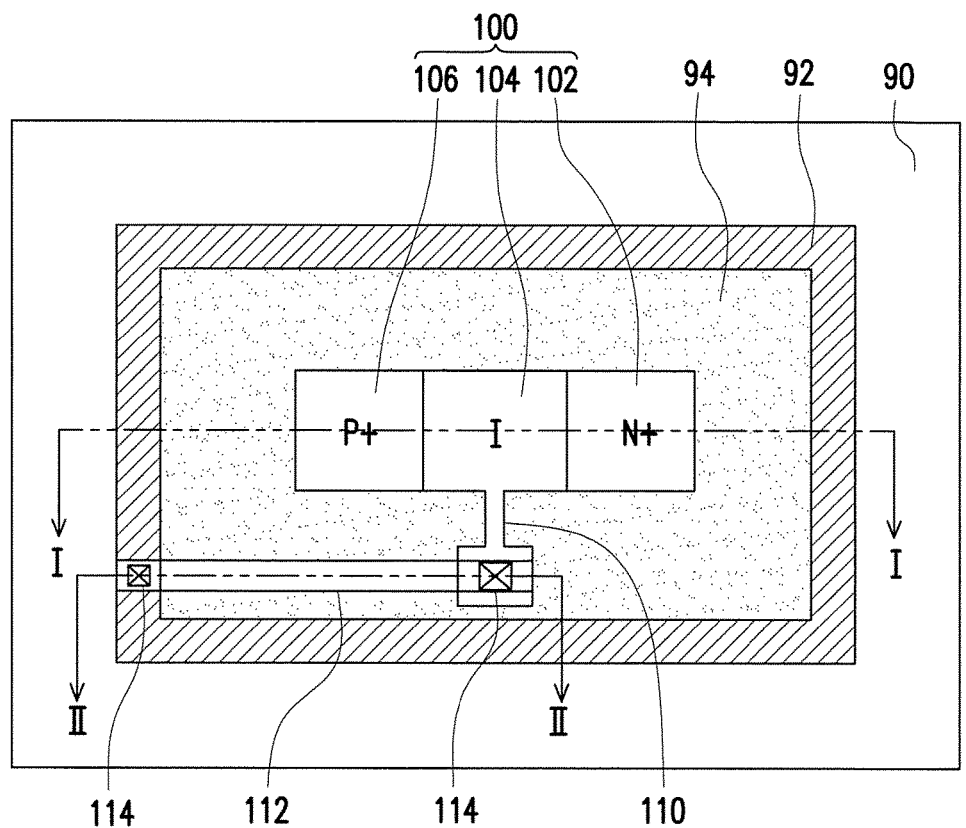
FIG. 2 is a drawing, schematically illustrating a top view of a PIN diode, according to an embodiment of the invention.
Figure 3:
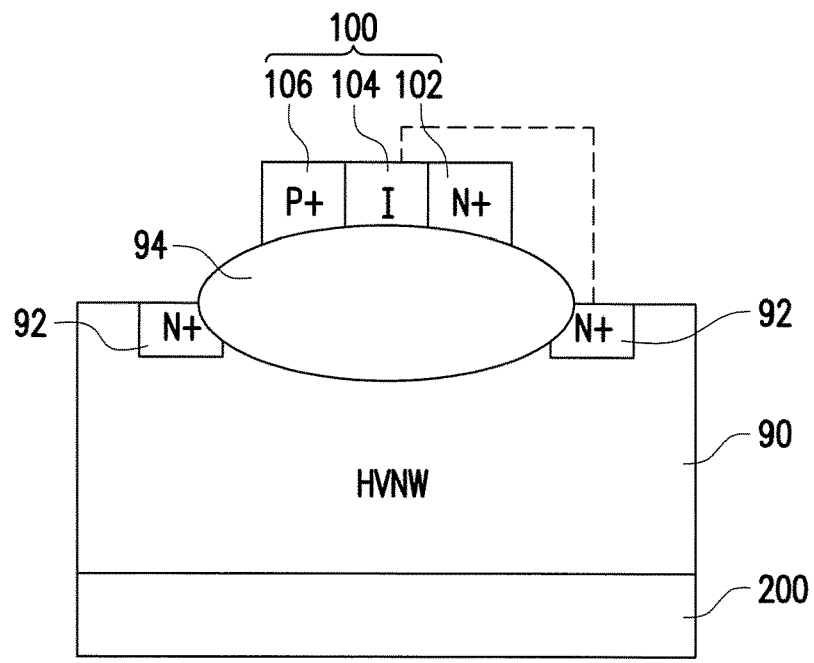
FIG. 3 is a drawing, schematically illustrating a cross-sectional structure of the PIN diode along a cutting line I-I in FIG. 2, according to an embodiment of the invention.

FIG. 2 is a drawing, schematically illustrating a top view of a PIN diode, according to an embodiment of the invention. FIG. 3 is a drawing, schematically illustrating a cross-sectional structure of the PIN diode along a cutting line I-I in FIG. 2, according to an embodiment of the invention. Referring to FIG. 2 and FIG. 3, the PIN diode 100 of the invention is formed on in insulating structure 94 of a semiconductor substrate 200. The substrate 200 is silicon substrate, as an example but not limited to the silicon substrate. The substrate 200 as usual is firstly doped in P conductive type, so the substrate in an example can also be represent by P-sub. In order to fabricate the device structure, subsequently, the substrate 200 in an example is firstly formed with an epitaxial layer, such as silicon epitaxial layer, to serve as an extension of the silicon substrate. However, the invention is not limited to the embodiment to form the epitaxial layer in an example. In other words, the substrate 200 can include the situation having the epitaxial layer or having no epitaxial layer. Then, the substrate 200 is doped to form a high voltage doped well 90. The high voltage doped well 90 in an example is a structure of N conductive type high voltage doped well (HVNW). In an embodiment, if the substrate 200 has no the epitaxial layer, the high voltage doped well 90 can be directly formed in the substrate 200 of silicon.

The insulating structure 94 is formed in the high voltage doped well 90 at a surface layer of the substrate 200. By using the usual semiconductor fabrication processes, the insulating structure 94 in an example can be buried oxide (BOX) layer, or shallow trench isolation (STI) layer, or field oxidation (FOX) layer. In the embodiment, the FOX layer is taken as an example. A surface doped region 92 is also formed in the high voltage doped well 90 and at the periphery of the insulating structure 94. The conductive type of the surface doped region 92 is the same as the conductive type of the high voltage doped well 90, so to supply a voltage to the high voltage doped well 90. Here, the surface doped region 92 in the embodiment is continuously enclosing the insulating structure 94, but the invention is limited to this embodiment. The surface doped region 92 can also be a single piece or multiple pieces. In other words, it can be accepted for the surface doped region 92 to provide the voltage to the high voltage doped well 90, without limiting to a specific structure.

The PIN diode 100 is formed on the insulating structure 94. The PIN diode 100 is formed by semiconductor layer, disposed on the insulating layer 94. The semiconductor layer of the PIN diode in an example is formed by another polysilicon layer, which has also been doped. In an embodiment, the semiconductor layer includes a first doped region 102 of a first conductive type and at least one second doped region 106 of a second conductive type, and at least one intrinsic region 104 without being doped or lightly doped between the first doped region 102 and the at least one second doped region 106. The intrinsic region 104 at a state not being doped has already an impurity concentration as the intrinsic level of the semiconductor material, such as about $1\times10^{14}/cm^3$. In another situation, it can be lightly doped by an impurity concentration of about $5\times10^{17}/cm^3$ in an example. The first conductive type of the embodiment is N conductive type, and then the second conductive type is P conductive type, so the first doped region 102 is cathode and the at least one second doped region 106 is anode. However in another embodiment, the first conductive type of the can be P conductive type, and the second conductive type can be N conductive type. In addition, the number of "at least one" is 1 or 2 or larger than 2. In this embodiment, the number is 1 as the example.

Due to a voltage bias between the first doped region 102 and the at least one second doped region 106, it would cross over the intrinsic region 104 and the voltage level usually has linear change in relating to the distance. The PIN diode 100 of the invention further connects the intrinsic region 94 to the surface doped region 92. In an embodiment, the high voltage doped well 90 also has a voltage about half of the voltage bias. This connection mechanism cannot be shown in the cross-sectional structure in FIG. 3, a dashed line is shown to indicate the connection mechanism between the intrinsic region 104 and the high voltage doped well 90.

Figure 4:
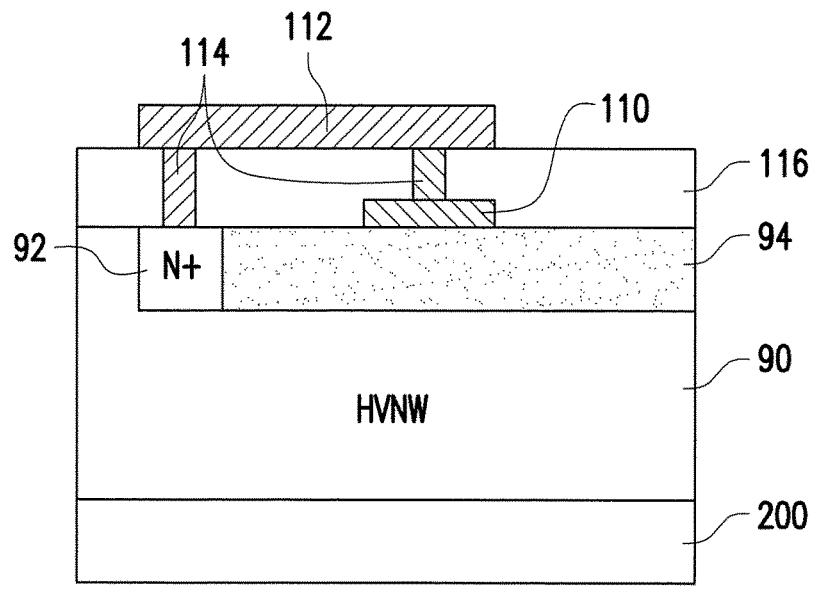
FIG. 4 is a drawing, schematically illustrating a cross-sectional structure of the PIN diode along a cutting line II-II in FIG. 2, according to an embodiment of the invention.

FIG. 4 is a drawing, schematically illustrating a cross-sectional structure of the PIN diode along a cutting line II-II in FIG. 2, according to an embodiment of the invention. Referring to FIG. 2 and FIG. 4, the intrinsic region 104 further includes a connection region 110 extending outward. Since the voltage level is the intrinsic region 104 is basically linearly changing along the direction of length, the corresponding location of the connection region 110 also has a voltage distribution, correspondingly. The connection region 110 at different location would have different voltage level. Generally, the location of the connection region 110 is at the middle region of the intrinsic region along the length direction. In a further example, it is a region close to the middle point. In other words, the location of the connection region 110 may have a proper distance from two ends of the intrinsic region 104.

The connection region 110 at a side of the intrinsic region 104 is extending outward, and the interconnection structure 112 with contact plug 114 can be further used to electrically connect to the surface doped region 92. As to the connection structure, based on the semiconductor fabrication processes in an embodiment, the dielectric layer 116 can be formed first. Then, the contact plug 114 is forming in the dielectric layer 116, aligning with the surface doped region 92. The conductive interconnection structure 112 in an example is polysilicon layer, formed on the insulating structure 94. In the embodiment, the insulating structure 94 is a STI layer as an example. After forming the dielectric layer 116, the connection region 110 is electrically connected to the surface doped region 92 through the contact plug 114 and the interconnection structure 112. The polysilicon layer can further be doped to improve conductivity. The interconnection structure 112 in an example can be metallic material. Here, the invention is not limited to the fabrication processes and the structure as provided. Actually, the contact plug 114 can be treated as a part of the interconnection structure 112, and is formed in the same deposition process for the conductive material. In other words, it has been sufficient for the interconnection structure 112 to electrically connect the connection region 110 of the intrinsic region 104 to the surface doped region 92.

Figure 5:
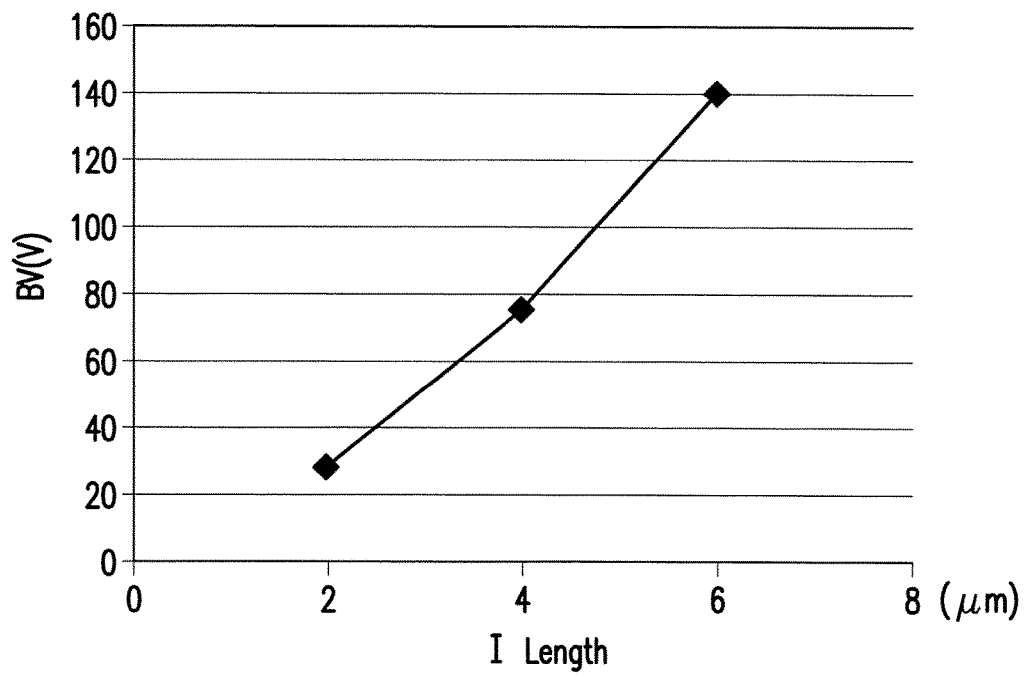
FIG. 5 is a drawing, schematically illustrating the length effect of the intrinsic region of the PIN diode, according to an embodiment of the invention.

The geometric structure of the PIN diode in an example can be bar-like shape. Lengths of the first doped region 102 and the second doped region 106 can be the same in an example, such as in a range of 2 microns to 10 microns, depending on actual design. In addition, the length of the intrinsic region 104 would affect the breakdown voltage. FIG. 5 is a drawing, schematically illustrating the length effect of the intrinsic region of the PIN diode, according to an embodiment of the invention. Referring to FIG. 5, the result indicates that the breakdown voltage (BV) versus the intrinsic region 104 with the length in a range of 2 microns to 6 microns can be approximately linear relation. The situation for the length larger than 6 microns is expected to remain the similar relation by gradually increasing. Therefore, the length of the intrinsic region 106 can be at least 2 microns in an example, depending on the actual design. In an example, the length is in a range between 4 microns and 6 microns. The breakdown voltage can be expected to be about 75V or higher.

Figure 6:
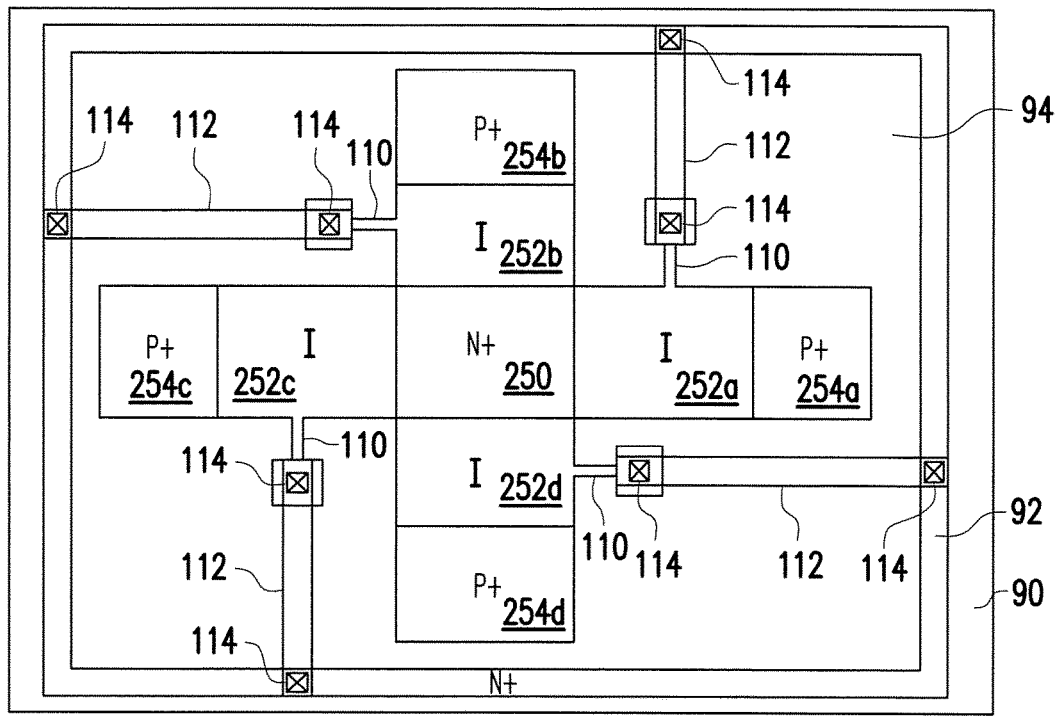
FIG. 6 is a drawing, schematically illustrating a top view of a PIN diode, according to an embodiment of the invention.

According to the structure in FIG. 2, the number of the PIN diode can be multiple, connected together. In other words, the number of "at least one" can be 2 or more. FIG. 6 is a drawing, schematically illustrating a top view of a PIN diode, according to an embodiment of the invention. Referring to FIG. 6, the number of the PIN diodes is 4 as an example of the embodiment for descriptions. However, the invention is not limited to four PIN diodes.

In FIG. 6, the same reference number represents the same element without further descriptions, but the differences in this embodiment are described. The first doped region 250 is N+ doped and is formed on the insulating structure 94, serving as a common region for the four PIN diodes. The shape of the first doped region 250 in an example is quadrilateral, so that the four PIN diodes are formed by extending outward from the four sides. In an example, four intrinsic regions 252a, 252b, 252c, 252d, indicated by "I" and abut the four sides of the first doped region 250, are formed on the insulating structure 94. Four second doped regions 254a, 254b, 254c, 254d, indicated by "P+" and respectively extending outward from the four intrinsic regions 252a, 252b, 252c, 252d, are formed on the insulating structure 94. Four interconnection structures 112 with the contact plugs 114 connect the intrinsic regions 252a, 252b, 252c, 252d to the surface doped region 92, which is also indicated by N+ and electrically contacts the high voltage doped well 90.

Figure 7:
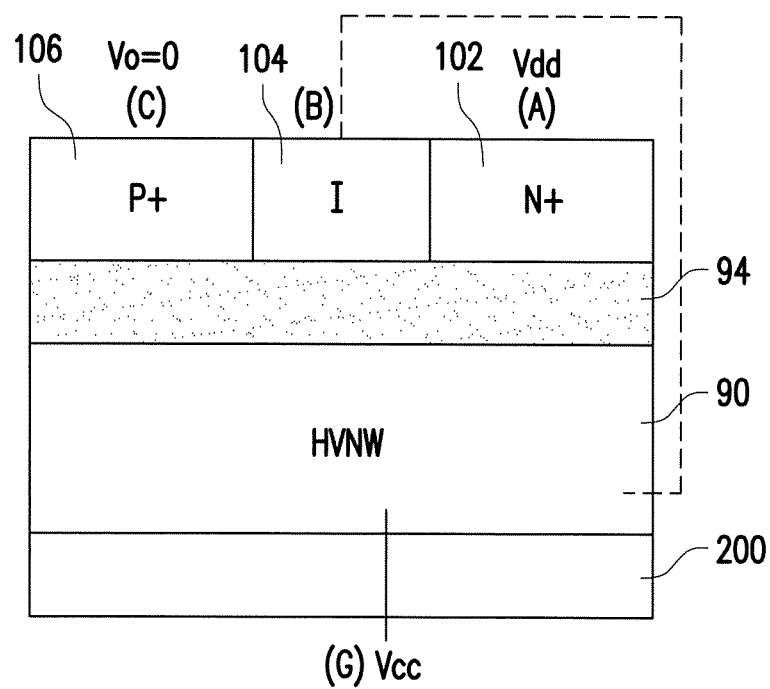
FIG. 7 is a drawing, schematically illustrating cross-sectional view of the PIN diode under the operation mechanism.

An embodiment is provided to describe the operation mechanism of the PIN diode in the invention. FIG. 7 is a drawing, schematically illustrating cross-sectional view of the PIN diode under the operation mechanism. Referring to FIG. 7, the first doped region 102 is N+ doped, serving as the cathode indicated by (A), and is applied by a voltage Vdd in high voltage operation. The second doped region 106 is P+ doped, serving as anode, indicated by (C), and is applied a voltage Vo=0V in high voltage operation. The intrinsic region 104, indicated by (B) is a region without doping. Further, the high voltage doped well 90, indicated by (G), is N conductive type and represented by HVNW.

In the above operation, if the connection point on the intrinsic region 104 is at the central point of the length, then the voltage level at the (B) point is about Vdd/2, applied to the high voltage doped well 90. Remarkably here, the high voltage doped well 90 in conventional structure is applied with a low voltage of Vcc. In the invention, the voltage bias ($V_{AG}$) from the point (A) to the pint (G) is $V_{AG}$=Vdd−Vdd/2. The voltage bias ($V_{BG}$) from the point (B) to the pint (G) is $V_{BG}$=Vdd/2−Vdd/2. The voltage bias ($V_{CG}$) from the point (C) to the pint (G) is $V_{CG}$=0−Vdd/2. Thus, the voltage bias along the perpendicular direction from the PIN diode to the high voltage doped well 90 is about Vdd/2. This would not cause the electric field strength like that in the conventional PIN diode of which the voltage bias for the $V_{AG}$ and the $V_{CG}$ is as high as Vdd, causing stronger electric filed at the perpendicular direction and then reducing the breakdown voltage.

The PIN diode structure in the invention also transmits the voltage level at the intrinsic region to the high voltage doped well at the lower part. As a result, the voltage level of the high voltage doped well is approximately at the middle value of the bias between the anode and the cathode, and the breakdown of the PIN diode can be effectively avoided. On the other hand, the breakdown voltage of the PIN diode is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A P-I-N (PIN) diode, formed on an insulating structure on
   a. semiconductor substrate, the insulating structure is on a high voltage doped well in the substrate, the PIN diode comprising:
   a semiconductor layer disposed on the insulating structure, wherein the semiconductor layer comprises:
   a first-doped region, having a first conductive type; at least one second doped region, having a second conductive type, opposite to the first conductive type;
   at least one intrinsic region comprising a connection region extending outward, without being doped or lightly doped between the first doped region and the at least one second doped region;
   at least one interconnection structure, disposed on the insulating structure to electrically connect the at least one intrinsic region to the high voltage doped well through the connection region and contact plug; and
   wherein the high voltage doped well is the first conductive type, the high voltage doped well further has a surface doped region of the first conductive type at the periphery of the insulating structure in electrical connection to the at least one interconnection structure, used to provide a voltage level as obtained at the at least one interconnection structure to the high voltage doped well.

2. The PIN diode of claim 1, wherein numbers of the at least one second doped region, the at least one intrinsic region and the at least one inter interconnection structure are same by 1 or 2 or larger than 2.

3. The PIN diode of claim 1, wherein the insulating structure is a buried oxide layer or shallow trench isolation layer, or a field oxidation layer.

4. The PIN diode of claim 1, wherein the first conductive type is N conductive type and the second conductive type is P conductive type, or first conductive type is P conductive type and the second conductive type is N conductive type.

5. The PIN diode of claim 1, wherein the first doped region of the semiconductor layer is a common region, the at least one second doped region with the at least one intrinsic region is extending outward from the first doped region.

6. The PIN diode of claim 1, wherein the at least one intrinsic region is between the first doped region and the at least one second doped region by a length of at least 2 microns.

7. The PIN diode of claim 1, wherein the at least intrinsic region is between the first doped region and the at least one second doped region by a length in a range of 4 microns to 6 microns.

8. The PIN diode of claim 1, wherein a position of the at least one intrinsic region being respectively connected with the at least one interconnection structure is at a middle region between the first doped region and the at least one second doped region.

9. The PIN diode of claim 1, wherein a position of the connection region has a distance with respect to the first doped region and the at least one second doped region.

* * * * *